United States Patent
Okuno et al.

(10) Patent No.: US 9,029,832 B2
(45) Date of Patent: May 12, 2015

(54) GROUP III NITRIDE SEMICONDUCTOR LIGHT-EMITTING DEVICE AND METHOD FOR PRODUCING THE SAME

(71) Applicant: Toyoda Gosei Co., Ltd., Kiyosu-shi (JP)

(72) Inventors: Koji Okuno, Kiyosu (JP); Atsushi Miyazaki, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/965,027

(22) Filed: Aug. 12, 2013

(65) Prior Publication Data

US 2014/0084241 A1    Mar. 27, 2014

(30) Foreign Application Priority Data

Sep. 26, 2012   (JP) ................. 2012-213287

(51) Int. Cl.
*H01L 29/06*   (2006.01)
*H01L 33/06*   (2010.01)
*H01L 33/02*   (2010.01)
*H01L 33/32*   (2010.01)

(52) U.S. Cl.
CPC .............. *H01L 33/06* (2013.01); *H01L 33/02* (2013.01); *H01L 33/32* (2013.01)

(58) Field of Classification Search
USPC .................. 257/15, 13, E33.01, E31.036
See application file for complete search history.

(56) References Cited

U.S. PATENT DOCUMENTS

2014/0084241 A1   3/2014 Okuno et al.

FOREIGN PATENT DOCUMENTS

| JP | 2002-064249 A | 2/2002 |
| JP | 2007-180495 A | 7/2007 |
| JP | 2011-049452 A | 3/2011 |

*Primary Examiner* — Amar Movva
(74) *Attorney, Agent, or Firm* — McGinn IP Law Group, PLLC

(57) ABSTRACT

The invention provides a Group III nitride semiconductor light-emitting device in which the strain in the light-emitting layer is relaxed, thereby attaining high light emission efficiency, and a method for producing the device. The light-emitting device of the present invention has a substrate, a low-temperature buffer layer, an n-type contact layer, a first ESD layer, a second ESD layer, an n-side superlattice layer, a light-emitting layer, a p-side superlattice layer, a p-type contact layer, an n-type electrode N1, a p-type electrode P1, and a passivation film F1. The second ESD layer has pits X having a mean pit diameter D. The mean pit diameter D is 500 Å to 3,000 Å. An InGaN layer included in the n-side superlattice layer has a thickness Y satisfying the following condition: $-0.029 \times D + 82.8 \leq Y \leq -0.029 \times D + 102.8$.

16 Claims, 7 Drawing Sheets

GROUP III NITRIDE SEMICONDUCTOR LIGHT-EMITTING DEVICE AND METHOD FOR PRODUCING THE SAME

BACKGROUND OF THE INVENTION

1. Field of the Invention

The present invention relates to a Group III nitride semiconductor light-emitting device and to a method for producing the same. More particularly, the present invention relates to a Group III nitride semiconductor light-emitting device in which strain applied to the light-emitting layer is relaxed, and to a method for producing the same.

2. Background Art

Generally, Group III nitride semiconductor light-emitting devices are produced through epitaxial growth of a Group III nitride semiconductor from a growth substrate. In this process, a plurality of Group III nitride semiconductor layers having different lattice constants are formed. Due to the lattice constant difference, strain (i.e., stress) generates in a relevant semiconductor layer. The stress generates a piezoelectric field, which deforms the potential of the quantum well of the light-emitting layer, thereby spatially separating electrons from holes. As a result, the probability of recombination between electrons and holes in the light-emitting layer decreases. In this case, light emission efficiency of the semiconductor light-emitting device drops.

In order to suppress, to a maximum possible extent, the effect of the strain generated in a semiconductor layer on the light-emitting layer, some techniques have been developed. One technique is a superlattice layer for relaxing the strain. The superlattice layer has two or more layer units having different lattice constants, whereby the strain applied to the light-emitting layer is relaxed. Another layer for relaxing the strain is a layer for preventing electrostatic breakdown of a semiconductor layer (hereinafter such a layer may be referred to as an "electrostatic-breakdown-voltage-improving layer"). Patent Document 1 discloses a technique of forming pits in an electrostatic-breakdown-voltage-improving layer (see, for example, paragraphs [0007] to [0010] of Patent Document 1). The electrostatic-breakdown-voltage-improving layer can prevent electrostatic breakdown of a semiconductor layer and can relax biaxial stress by virtue of the pits.

Patent Document 1: Japanese Patent Application Laid-Open (kokai) No. 2007-180495

However, even when a superlattice layer is simply combined with an electrostatic-breakdown-voltage-improving layer, the two layers being formed so as to relax the strain to a maximum extent, the effect of relaxing the strain cannot be attained to a maximum extent. Instead, the light emission intensity of the semiconductor light-emitting device may be reduced in some cases. This is conceivably because the strain relaxation mechanism of the superlattice layer differs from that of the electrostatic-breakdown-voltage-improving layer. Therefore, strain relaxation is preferably realized by not only provision of a superlattice layer and an electrostatic-breakdown-voltage-improving layer in combination but also additional means.

SUMMARY OF THE INVENTION

The present invention has been accomplished for solving the aforementioned problems involved in conventional techniques. Accordingly, an object of the present invention is to provide a Group III nitride semiconductor light-emitting device in which the strain applied to the light-emitting layer is relaxed, to thereby attain high light emission efficiency. Another object is to provide a method for producing the Group III nitride semiconductor light-emitting device.

Accordingly, in a first aspect of the present invention, there is provided a Group III nitride semiconductor light-emitting device comprising an underlying layer formed of a Group III nitride semiconductor, a superlattice layer formed on the underlying layer, and a light-emitting layer formed on the superlattice layer. The underlying layer has pits. The superlattice layer has at least an Indium-containing layer formed of an Indium-containing Group III nitride semiconductor. The mean pit diameter D (Å) as measured at the interface between the underlying layer and the superlattice layer satisfies the following condition:

500 Å≤D≤3,000 Å. The Indium-containing layer has a thickness Y (Å) satisfying the following condition:

$$-0.029 \times D + 82.8 \leq Y \leq -0.029 \times D + 102.8.$$

In the Group III nitride semiconductor light-emitting device, the strain applied to the light-emitting layer is relaxed. The pit-provided underlying layer, and the superlattice layer formed on the underlying layer appropriately absorb strain. As a result, the strain applied to the light-emitting layer is relaxed. Thus, the intensity of the piezoelectric field generated in the light-emitting layer is smaller than that of a conventional semiconductor light-emitting device. That is, the light emission efficiency of the Group III nitride semiconductor light-emitting device is higher than that of a conventional semiconductor light-emitting device.

A second aspect of the present invention is drawn to a specific embodiment of the Group III nitride semiconductor light-emitting device, wherein the superlattice layer is formed of repeatedly deposited layer units. Each layer unit has two or more Indium-containing layers. The thickness Y (Å) of the Indium-containing layer is that measured for a layer of the superlattice layer having the smallest bandgap. In this case, the Indium-containing layer having the aforementioned condition of the thickness Y (Å) has the highest In compositional ratio.

A third aspect of the present invention is drawn to a specific embodiment of the Group III nitride semiconductor light-emitting device, wherein the bottom ends of the pits are located within the thickness of the underlying layer. The pits are induced by threading dislocation and formed during the growth of the underlying layer. As used herein, the term "underlying layer" refers to a semiconductor layer beneath the superlattice layer. The underlying layer may be a semiconductor layer composed of two or more layers.

A fourth aspect of the present invention is drawn to a specific embodiment of the Group III nitride semiconductor light-emitting device, wherein the underlying layer is an electrostatic-breakdown-voltage-improving layer for preventing electrostatic breakdown of each semiconductor layer.

A fifth aspect of the present invention is drawn to a specific embodiment of the Group III nitride semiconductor light-emitting device, wherein the mean pit diameter D (Å) satisfies the following condition:

500 Å≤D≤1,500 Å. When the pit diameter D falls within the range, the Group III nitride semiconductor light-emitting device has sufficient resistance to reverse voltage.

In a sixth aspect of the present invention, there is provided a method for producing a Group III nitride semiconductor light-emitting device comprising:

forming an underlying layer, forming a superlattice layer on the underlying layer, and forming a light-emitting layer on the superlattice layer. In formation of the underlying layer, pits are provided in the underlying layer such that the mean pit diameter D (Å) as measured at the interface between the underlying layer and the superlattice layer satisfies the following condition:

500 Å≤D≤3,000 Å. In formation of the superlattice layer, an Indium-containing layer is formed from an Indium-containing Group III nitride semiconductor such that the Indium-containing layer has a thickness Y (Å) satisfying the following condition:

$$-0.029 \times D + 82.8 \leq Y \leq -0.029 \times D + 102.8.$$

Through employment of the method for producing a Group III nitride semiconductor light-emitting device, the strain propagating from a nitride semiconductor template—a layer under the underlying layer—can be efficiently relaxed, whereby the strain applied to the light-emitting layer can be reduced. In addition, the crystallinity of the formed semiconductor layers is maintained, and the portions of the semiconductor layers other than pit-provided regions have high flatness. Therefore, the formed light-emitting layer has high crystallinity. In other words, a Group III nitride semiconductor light-emitting device having high light emission efficiency can be produced. In the thus-produced Group III nitride semiconductor light-emitting device, the strain applied to the light-emitting layer is relaxed, since the pit-provided underlying layer, and the superlattice layer disposed on the underlying layer suitably absorb the strain. Thus, the strain applied to the light-emitting layer can be reduced, and the effect of a piezoelectric field on the light-emitting layer is reduced.

A seventh aspect of the present invention is drawn to a specific embodiment of the method for producing a Group III nitride semiconductor light-emitting device, wherein, in formation of the superlattice layer, layer units each having two or more Indium-containing layers are repeatedly deposited, and an Indium-containing layer of the superlattice layer having the smallest bandgap is formed so as to have the thickness Y (Å) of the Indium-containing layer.

An eighth aspect of the present invention is drawn to a specific embodiment of the method for producing a Group III nitride semiconductor light-emitting device, wherein the mean pit diameter D (Å) is adjusted to satisfy the following condition: 500 Å≤D≤1,500 Å. The thus-produced Group III nitride semiconductor light-emitting device has sufficient resistance to reverse voltage.

The present invention enables provision of a Group III nitride semiconductor light-emitting device in which the strain applied to the light-emitting layer is relaxed, to thereby attain high light emission efficiency, and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
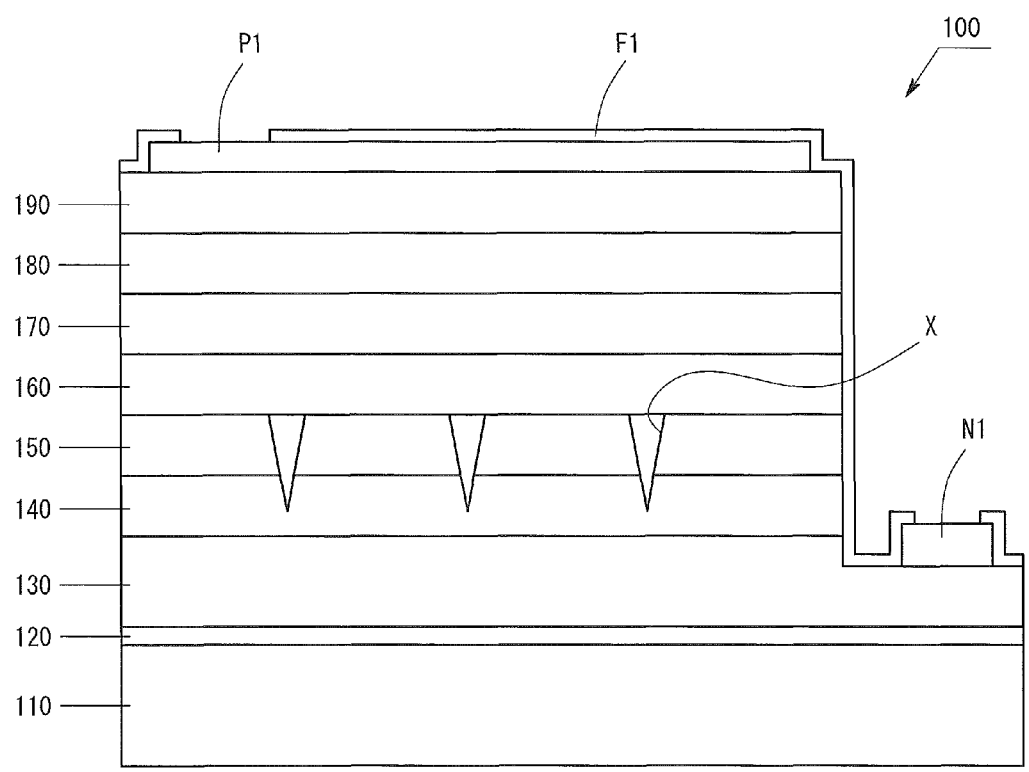
FIG. 1 is a schematic view of the structure of a Group III nitride semiconductor light-emitting device according to an embodiment.

Specific embodiments of the present invention will next be described with reference to the drawings by taking, as an example, the case where a semiconductor light-emitting device is produced. However, the present invention is not limited to the embodiments. Needless to say, the structures of the layers and electrodes forming the below-mentioned light-emitting devices are merely examples, and may differ from those exemplified in the below-described embodiments. The thickness of each layer, which is schematically shown in the drawings, does not correspond to its actual value. Also, the dimensions of the pits shown in the drawings are larger than the actual values.

1. SEMICONDUCTOR LIGHT-EMITTING DEVICE

Figure 2:
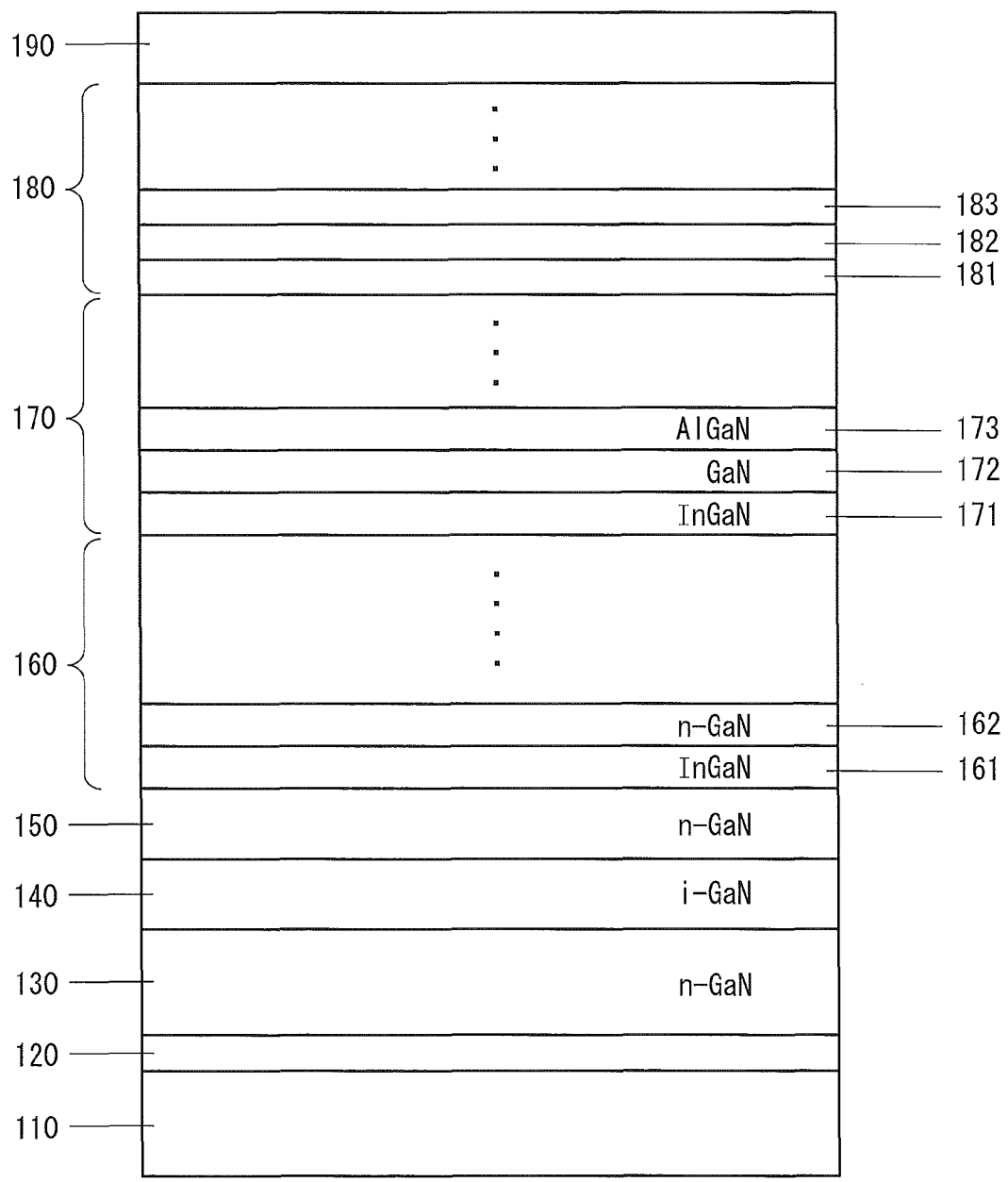
FIG. 2 is a schematic view of the layer structure of the layers forming the Group III nitride semiconductor light-emitting device according to the embodiment.

FIG. 1 is a schematic view of the structure of a Group III nitride semiconductor light-emitting device 100 according to the present embodiment. As shown in FIG. 1, the light-emitting device 100 is a face-up-type semiconductor light-emitting device. The light-emitting device 100 has a plurality of semiconductor layers formed of a Group III nitride semiconductor. The layer structure of the semiconductor layers is shown in FIG. 2.

As shown in FIG. 1, the light-emitting device 100 has a substrate 110, a low-temperature buffer layer 120, an n-type contact layer 130, a first ESD layer 140, a second ESD layer 150, an n-side superlattice layer 160, a light-emitting layer 170, a p-side superlattice layer 180, a p-type contact layer 190, an n-type electrode N1, a p-type electrode P1, and a passivation film F1.

On the main surface of the substrate 110, semiconductor layers are formed; i.e., the low-temperature buffer layer 120, the n-type contact layer 130, the first ESD layer 140, the second ESD 150, the n-side superlattice layer 160, the light-emitting layer 170, the p-side superlattice layer 180, and the p-type contact layer 190, in this order. The n-type electrode N1 is formed on the n-type contact layer 130, and the p-type electrode P1 is formed on the p-type contact layer 190.

The substrate 110 serves as a growth substrate having the main surface on which the semiconductor layers are formed through MOCVD. The surface of the substrate 110 may be embossed. The substrate 110 is made of sapphire. Other than sapphire, materials such as SiC, ZnO, Si, and GaN may be used.

The low-temperature buffer layer 120 is formed on the main surface of the substrate 110. The low-temperature buffer layer 120 is employed so as to form crystallization cores at high density in the sapphire substrate 110. By virtue of the low-temperature buffer layer 120, growth of a GaN layer having a flat surface is promoted. The low-temperature buffer layer 120 is made of a material such as AlN or GaN.

The n-type contact layer 130 is located beneath the n-type electrode N1. The n-type contact layer 130 is in ohmic contact with the n-type electrode N1. The n-type contact layer 130 is formed on the low-temperature buffer layer 120. The n-type contact layer 130 is an n-type GaN layer having an Si concentration of $1 \times 10^{18}/cm^3$ or higher. The n-type contact layer 130 may be formed of a plurality of layers having different carrier concentrations, for the purpose of enhancement of ohmic contact with the n-type electrode N1. The thickness of the n-type contact layer 130 is, for example, 4 μm. Needless to say, other thickness values may be employed.

The first ESD layer 140 serves as an electrostatic-breakdown-voltage-improving layer for preventing electrostatic breakdown of each semiconductor layer. The first ESD layer 140 is formed on the n-type contact layer 130. The first ESD layer 140 is a non-doped i-GaN layer. The first ESD layer 140 has a thickness of 300 nm.

The second ESD layer 150 serves as an electrostatic-breakdown-voltage-improving layer for preventing electrostatic breakdown of each semiconductor layer. The second ESD layer 150 is an Si-doped n-type GaN layer. The second ESD layer 150 has a thickness of about 30 nm. The second ESD layer 150 has an Si concentration of about $5 \times 10^{18}/cm^3$.

The n-side superlattice layer 160 serves as a strain-relaxing layer for relaxing the stress applied to the light-emitting layer 170. More specifically, the n-side superlattice layer 160 is an n-side superlattice layer having a superlattice structure. As shown in FIG. 2, the n-side superlattice layer 160 is formed by repeatedly depositing layer units each being formed of an InGaN layer 161 and an n-type GaN layer 162. The number of repetitions is 10 to 20. However, the number may fall outside the range. The InGaN layer 161 has an In compositional ratio of 2% to 20%. The In compositional ratio of the InGaN layer 161 is smaller than that of an InGaN layer 171 included in the below-described light-emitting layer 170. When the In compositional ratio of the InGaN layer 161 is not smaller than that of the InGaN layer 171 included in the light-emitting layer 170, the InGaN layer 161 disadvantageously absorbs the light emitted by the light-emitting layer 170. The thickness of the InGaN layer 161 is 2 Å to 90 Å. The n-GaN layer 162 has a thickness of 10 Å to 50 Å. The n-GaN layers 162, which are repeatedly deposited in the n-side superlattice layer 160, have the same thickness.

The InGaN layer 161 is an Indium-containing layer. The bandgap of the InGaN layer is smaller than that of the n-type GaN layer 162. The InGaN layer 161 has the smallest bandgap among the layers forming the n-side superlattice layers 160.

The light-emitting layer 170 emits light through recombination of electrons and holes. The light-emitting layer 170 is formed on the n-side superlattice layer 160. The light-emitting layer 170 is formed by repeatedly depositing an InGaN layer 171, a GaN layer 172, and an AlGaN layer 173. The number of repetitions is 3 to 20. The InGaN layer 171 has an In compositional ratio of 5% to 40%. The thickness of the InGaN layer 171 is 10 Å to 70 Å. The GaN layer 172 has a thickness of 5 Å to 70 Å. The AlGaN layer 173 has an Al compositional ratio of 5% to 40%. The AlGaN layer 173 has a thickness of 5 Å to 70 Å. These values are merely examples, and other values may be employed.

The p-side superlattice layer 180 is formed on the light-emitting layer 170. The p-side superlattice layer 180 is formed by repeatedly depositing a non-doped AlGaN layer 181, a p-type InGaN layer 182, and a p-type AlGaN layer 183. For example, the number of repetitions is 5. The non-doped AlGaN layer 181 has an Al compositional ratio of 5% to 40%. The non-doped AlGaN layer 181 has thickness of 5 Å to 70 Å. The p-type InGaN layer 182 has an In compositional ratio of 2% to 20%. The In compositional ratio of the p-type InGaN layer 182 is smaller than that of the InGaN layer 171 included in the light-emitting layer 170. The thickness of the p-type InGaN layer 182 is 10 Å to 70 Å. The p-type AlGaN layer 183 has an Al compositional ratio of 10% to 20%. The thickness of the p-type AlGaN layer 183 is 5 Å to 70 Å. These values are merely examples, and other values may be employed. Also, another layer structure may be employed.

The p-type contact layer 190 is formed on the p-side superlattice layer 180. The p-type contact layer 190 is provided so as to establish ohmic contact with the p-type electrode P1. The p-type contact layer 190 has a thickness of 80 nm. The p-type contact layer 190 is doped with Mg at an Mg concentration of $1 \times 10^{19}/cm^3$ to $1 \times 10^{22}/cm^3$.

The p-type electrode P1 is formed on the p-type contact layer 190. The p-type electrode P1 is in ohmic contact with the p-type contact layer 190. The p-type electrode P1 is made of ITO.

The n-type electrode N1 is formed on the n-type contact layer 130. The n-type electrode N1 is in ohmic contact with the n-type contact layer 130. The n-type electrode N1 is formed by sequentially forming V film and Al film on the n-type contact layer 130. Alternatively, the n-type electrode N1 may be formed by sequentially forming Ti film and Al film.

The passivation film F1 covers the side surfaces of the n-type contact layer 130, the first ESD layer 140, the second ESD layer 150, the n-side superlattice layer 160, the light-emitting layer 170, the p-side superlattice layer 180, and the p-type contact layer 190, and portions of the p-type electrode P1 and the n-type electrode N1. In other words, the remaining portions of the p-type electrode P1 and the n-type electrode N1 are not covered with the passivation film F1 and are exposed to the atmosphere. The passivation film F1 is made of, for example, $SiO_2$.

2. PITS PROVIDED IN ELECTROSTATIC-BREAKDOWN-VOLTAGE-IMPROVING LAYER

Figure 3:
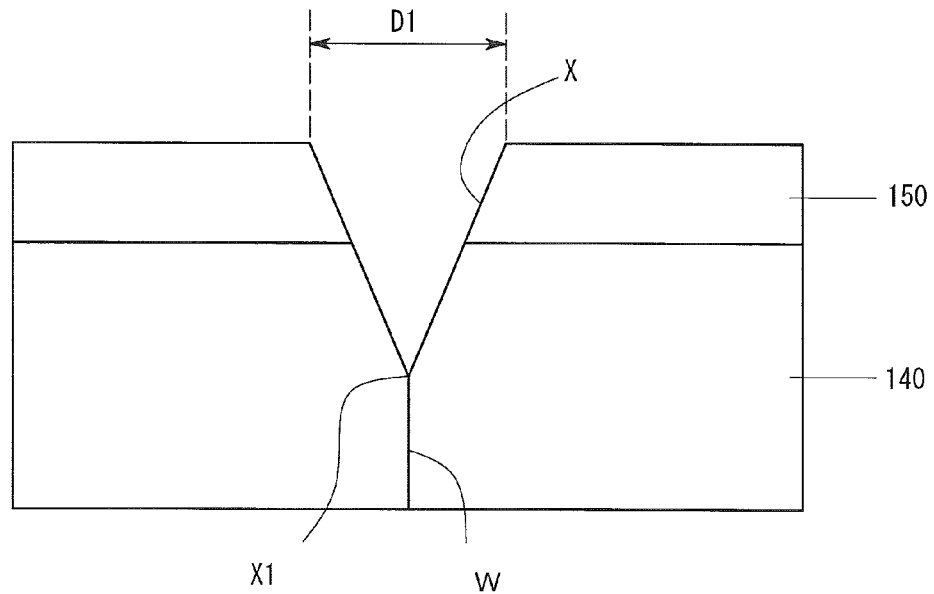
FIG. 3 is a schematic view of a pit provided in the electrostatic-breakdown-voltage-improving layer according to an embodiment.

With reference to FIG. 3, a pit X provided in the electrostatic-breakdown-voltage-improving layer (i.e., the first ESD layer 140 and the second ESD layer 150) will be described. The pit X is induced by a threading dislocation W. That is, the pit X generates at the threading dislocation W. The threading dislocation W propagates in the growth direction of the semiconductor layer. Then, when the threading dislocation W has reached the first ESD layer 140, the pit X is formed. As the growth of the electrostatic-breakdown-voltage-improving layer proceeds, the pit X grows in a direction orthogonal to the layer growth direction. Thus, since the pit X is induced at the threading dislocation W, the pit density is almost equal to the threading dislocation density. Thus, when the threading dislocation density is about $1 \times 10^7$ $(1/cm^2)$ to about $3 \times 10^{10}$ $(1/cm^2)$, the pit density is also about $1 \times 10^7$ $(1/cm^2)$ to about $3 \times 10^{10}$ $(1/cm^2)$.

Therefore, as the thickness of the first ESD layer 140 and that of the second ESD layer 150 increase, the pit diameter D1 at the top surface of the second ESD layer 150 increases. In addition, the bottom end X1 of the pit X is located within the thickness of the electrostatic-breakdown-voltage-improving layer. The pit X extends from the first ESD layer 140 to the n-side superlattice layer 160. The pit X is closed by the bottom surface of the n-side superlattice layer 160 (as viewed from the top in FIG. 1).

The pit X assumes a conical hole or a six-sided pyramidal hole. In the case of a conical hole, the pit diameter D1 corresponds to the diameter of the pit X as measured at the top surface of the second ESD layer 150; i.e., at the interface S1 between the second ESD layer 150 and the n-side superlattice layer 160.

In the case where the pit X assumes a six-sided pyramidal hole, the cross-section of the pit X, cut along the face orthogonal to the growth direction of the pit X, is generally a regular hexagon. In this case, the pit diameter D1 of the pit X is defined as the length of the line segment, on a cross-section, from one apex of the hexagon to the opposite apex. The pit diameter D1 corresponds to the length of the line segment diameter of the pit X as measured at the top surface of the second ESD layer 150; i.e., at the interface S1 between the second ESD layer 150 and the n-side superlattice layer 160.

Any of the above definition may be adopted, depending on the cross-sectional shape of the pit X. Theoretically, the cross-sectional shape of the pit X is a hexagon. However, as described in the experiment section hereinbelow, the actual cross-sectional shape of the pit X is generally a circle. Thus, hereinafter, the pit diameter D1 will be defined, assuming that the cross-sectional shape of the pit X is a circle.

The mean pit diameter D is an averaged pit diameter D1 as measured at the interface S1. That is, the mean pit diameter D is calculated by averaging the values of pit diameter D1 of all pits X as measured at the interface S1 between the second ESD layer 150 and the n-side superlattice layer 160.

The mean pit diameter D varies in accordance with the thickness of the second ESD layer 150 and with the temperature at which the second ESD 150 is grown. As the thickness of the second ESD layer 150 increases, the mean pit diameter D increases. In contrast, as the thickness of the second ESD layer 150 decreases, the mean pit diameter D decreases. Also, as the second ESD layer 150 growth temperature is elevated, the mean pit diameter D decreases. In contrast, as the second ESD layer 150 growth temperature is lowered, the mean pit diameter D increases. Thus, the mean pit diameter D can be regulated through modifying the thickness of the second ESD layer 150 and the growth temperature.

The mean pit diameter D satisfies the following condition (1):

$$500 \ \text{Å} \leq D \leq 3{,}000 \ \text{Å} \quad (1).$$

D: Mean pit diameter as measured at the top surface (interface S1) of the second ESD layer 150

When the mean pit diameter D is smaller than 500 Å, the synergistic effect of relaxing the strain by the pit X and the n-side superlattice layer 160 is small, whereas when the mean pit diameter D is in excess of 3,000 Å, the surface of the second ESD layer 150 is impaired. In this case, the crystal quality of the semiconductor layer(s) disposed on the second ESD layer 150 is impaired.

3. RELATIONSHIP BETWEEN PITS OF THE ELECTROSTATIC-BREAKDOWN-VOLTAGE-IMPROVING LAYER AND THE THICKNESS OF THE SUPERLATTICE LAYER

Next will be described the relationship between the second ESD layer 150 and the n-side superlattice layer 160. In this embodiment, the InGaN layer 161 is formed such that the mean pit diameter D of the second ESD layer 150 and the thickness Y (see FIG. 4) of the InGaN layer 161 included in the n-side superlattice layer 160 satisfy the following condition (2):

$$-0.029 \times D + 82.8 \leq Y \leq -0.029 \times D + 102.8 \quad (2)$$

Y: Thickness of the InGaN layer 161 included in the n-side superlattice layer 160

The thickness Y of the InGaN layer 161 is adjusted to fall within the range for the following reason. The InGaN layer 161 is a small-bandgap layer among the layers forming the n-side superlattice layer 160. That is, the InGaN layer 161 has a large In compositional ratio. As compared with an Indium-free semiconductor layer, bonding strength between atoms is weak in an Indium-containing semiconductor layer. Thus, such an Indium-containing semiconductor layer readily deforms. In other words, the InGaN layer 161 exhibits a high effect of relaxing the strain in the n-side superlattice layer 160. Therefore, the thickness Y of the InGaN layer 161 is an important factor in relation to strain relaxation by the pits X of the second ESD 150.

Figure 4:
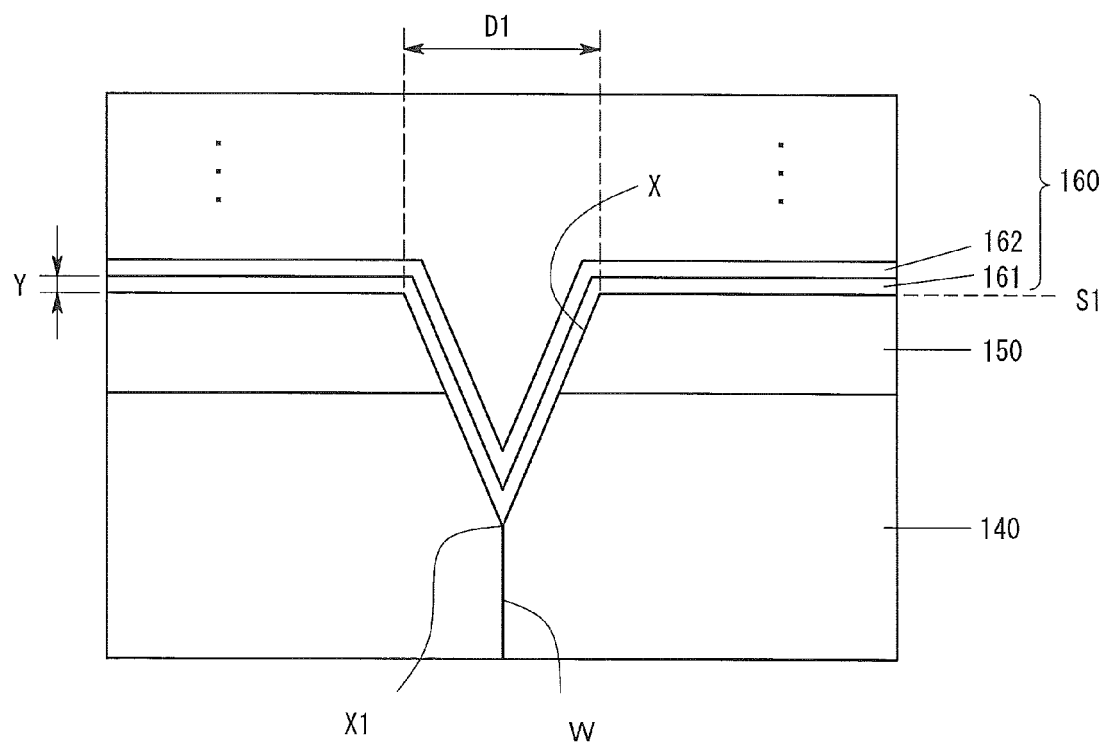
FIG. 4 is a schematic view of a pit provided in the electrostatic-breakdown-voltage-improving layer according to an embodiment, and the thickness of the superlattice layer.

The mean pit diameter D satisfies the condition (1). The condition (1) will be described in detail in the below-described experiment section. In FIG. 4, the diameter of the pit X decreases with the growth of the n-side superlattice layer 160. However, the diameter of the pit X may be increased with the growth of the n-side superlattice layer 160. In an actual case, whether the diameter of the pit X provided in the electrostatic-breakdown-voltage-improving layer increases or decreases with the subsequent growth of a semiconductor layer depends on the semiconductor growth conditions.

4. METHOD OF PRODUCING SEMICONDUCTOR LIGHT-EMITTING DEVICE

The method of producing the light-emitting device 100 according to this embodiment will be described. The aforementioned respective semiconductor layers are formed through epitaxial crystal growth by metal-organic chemical vapor deposition (MOCVD). The carrier gas employed in the method is hydrogen ($H_2$), nitrogen ($N_2$), or a gas mixture of hydrogen and nitrogen ($H_2+N_2$). Ammonia gas ($NH_3$) is employed as a nitrogen source. Trimethylgallium ($Ga(CH_3)_3$) is employed as a Ga source. Trimethylindium ($In(CH_3)_3$) is employed as an In source. Trimethylaluminum ($Al(CH_3)_3$) is employed as an Al source. Silane ($SiH_4$) is employed as an n-type dopant gas. Cyclopentadienylmagnesium ($Mg(C_5H_5)_2$) is employed as a p-type dopant gas.

4-1. n-Type Contact Layer Formation Step

Firstly, the low-temperature buffer layer 120 is formed on the main surface of the substrate 110. On the buffer layer 120, the n-type contact layer 130 is formed. The substrate temperature in this step is adjusted to 1,080° C. to 1,140° C. The Si concentration is $1 \times 10^{18}/cm^3$ or higher.

4-2. First Electrostatic-Breakdown-Voltage-Improving Layer Formation Step

Figure 5:
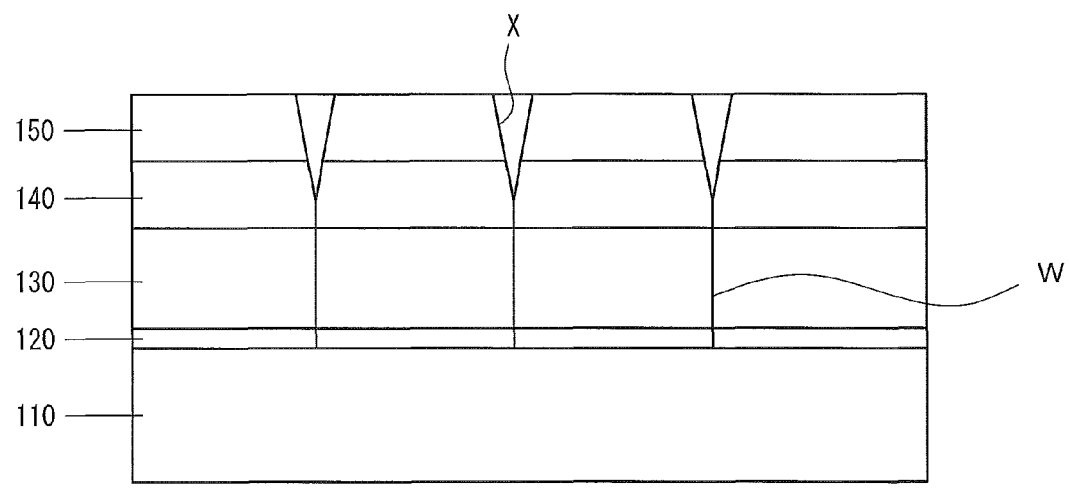
FIG. 5 is a schematic view illustrating the method for producing a light-emitting device according an embodiment (part 1)

Then, the first ESD layer 140 is formed. As described above, the first ESD layer 140 is made of i-GaN. Therefore, feed of silane ($SiH_4$) is stopped. The substrate temperature in this process is adjusted to 750° C. to 950° C. As shown in FIG. 5, pits X are provided in this step.

4-3. Second Electrostatic-Breakdown-Voltage-Improving Layer Formation Step

Then, the second ESD layer 150 is formed. As described above, the second ESD layer 150 is made of n-type GaN. Therefore, silane (SiR$_4$) is fed again. The substrate temperature in this process is adjusted to fall within the same range as employed in the first electrostatic-breakdown-voltage-improving layer formation step. As shown in FIG. 5, pits X are also provided in this step. The mean pit diameter D falls within the range defined by the condition (1). That is, the mean pit diameter D is adjusted to fall within a range of to fall within 500 Å to 3,000 Å.

4-4. n-Side Superlattice Layer Formation Step

Then, the n-side superlattice layer 160 is formed. Firstly, the InGaN layer 161 is formed on the second ESD layer 150, and then the n-type GaN layer 162 is formed on the InGaN layer 161. Then, the combination of InGaN layer 161 and the n-type GaN layer 162 is employed as a layer unit, and the unit is repeatedly formed. The substrate temperature at the formation of the InGaN layer 161 is 700° C. to 950° C. The substrate temperature at the formation of the n-type GaN layer 162 is 700° C. to 950° C.

4-5. Light-Emitting Layer Formation Step

Subsequently, the light-emitting layer 170 is formed by repeatedly depositing the InGaN layer 171, the GaN layer 172, and the AlGaN layer 173. The substrate temperature in the step is adjusted to 700° C. to 900° C.

4-6. p-Side Superlattice Layer Formation Step

Then, the p-side superlattice layer 180 is formed. In this step, the non-doped AlGaN layer 181, the p-type InGaN layer 182, and the p-type AlGaN layer 183 are repeatedly deposited.

4-7. p-Type Contact Layer Formation Step

Figure 6:
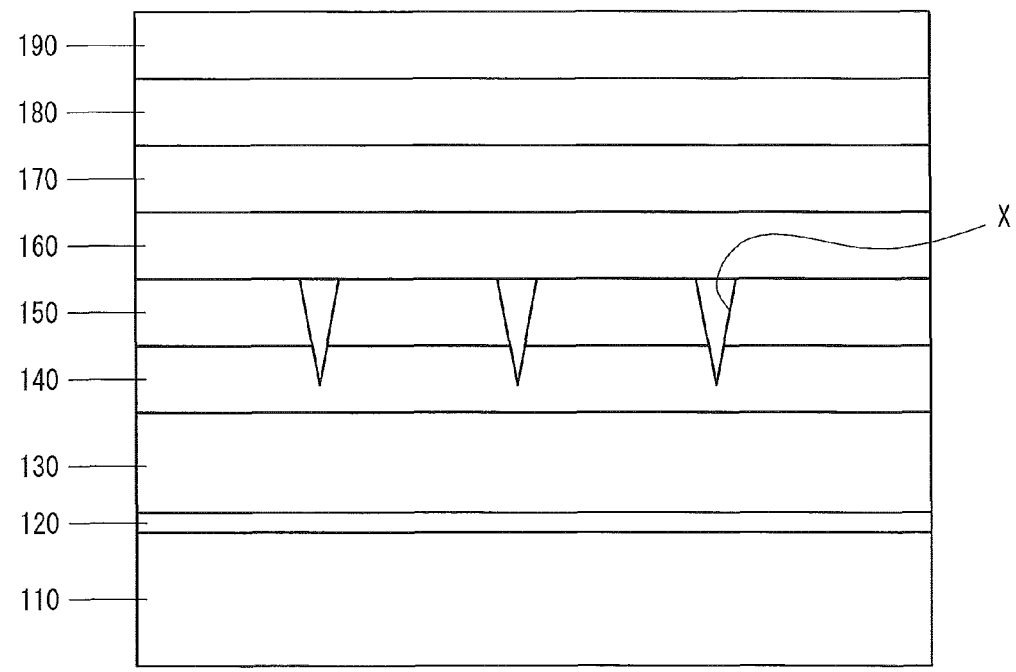
FIG. 6 is a schematic view illustrating the method for producing a light-emitting device according an embodiment (part 2)

Then, the p-type contact layer 190 is formed. The substrate temperature is adjusted to 900° C. to 1,050° C. As a result, as shown in FIG. 6, semiconductor layers are deposited on the substrate 110.

4-8. Electrode Formation Step

Then, the p-type electrode P1 is formed on the p-type contact layer 190. The semiconductor layer deposited structure is partially removed through laser radiation or etching from the p-type contact layer 190, to thereby expose the n-type contact layer 130. The n-type electrode N1 is formed on the exposed area of the n-type contact layer 130. Formation of the p-type electrode P1 and formation of the n-type electrode N1 may be carried out in any order.

4-9. Insulating Film Formation Step

Then, side surfaces of the semiconductor layers, a part of p-type electrode P1, and a part of n-type electrode N1 are covered with the passivation film F1. Although an example of the passivation film F1 is an SiO$_2$ film, other transparent insulating films may be employed. In an alternative procedure, the entirety of the light-emitting device 100 is covered with the passivation film F1, and then portions of interest are exposed.

4-10. Other Steps

In addition to the aforementioned steps, thermal treatment and other steps may be performed. Through carrying out the steps, production of the light-emitting device 100 shown in FIG. 1 is complete.

5. EXPERIMENTS

5-1. Mean Pit Diameter in the Second ESD Layer and Thickness of the InGaN Layer Included in the n-Side Superlattice Layer The relationship between the thickness Y of the InGaN layer 161 included in the n-side superlattice layer 160 and the mean pit diameter D of the top surface of the second ESD layer 150 was investigated. The experiments performed for the investigation will be described in detail.

In this experiment, the In compositional ratio of the InGaN layer 161 was adjusted to 9%, and the thickness of the n-type GaN layer 162 was adjusted to 20 Å. The n-type impurity concentration of the n-type GaN layer 162 is preferably $1 \times 10^7$ (1/cm$^3$) to $3 \times 10^8$ (1/cm$^3$). The number of repetitions of formation of the InGaN layer 161 and the n-type GaN layer 162 was 15 times. The substrate temperature at the growth of the InGaN layer 161 was adjusted to 830° C., and that at the growth of n-type GaN layer 162 was adjusted to 830° C. The cross-sectional of the pit X at the interface S1, as measured under an atomic force microscope (AFM), was a circle.

Figure 7:
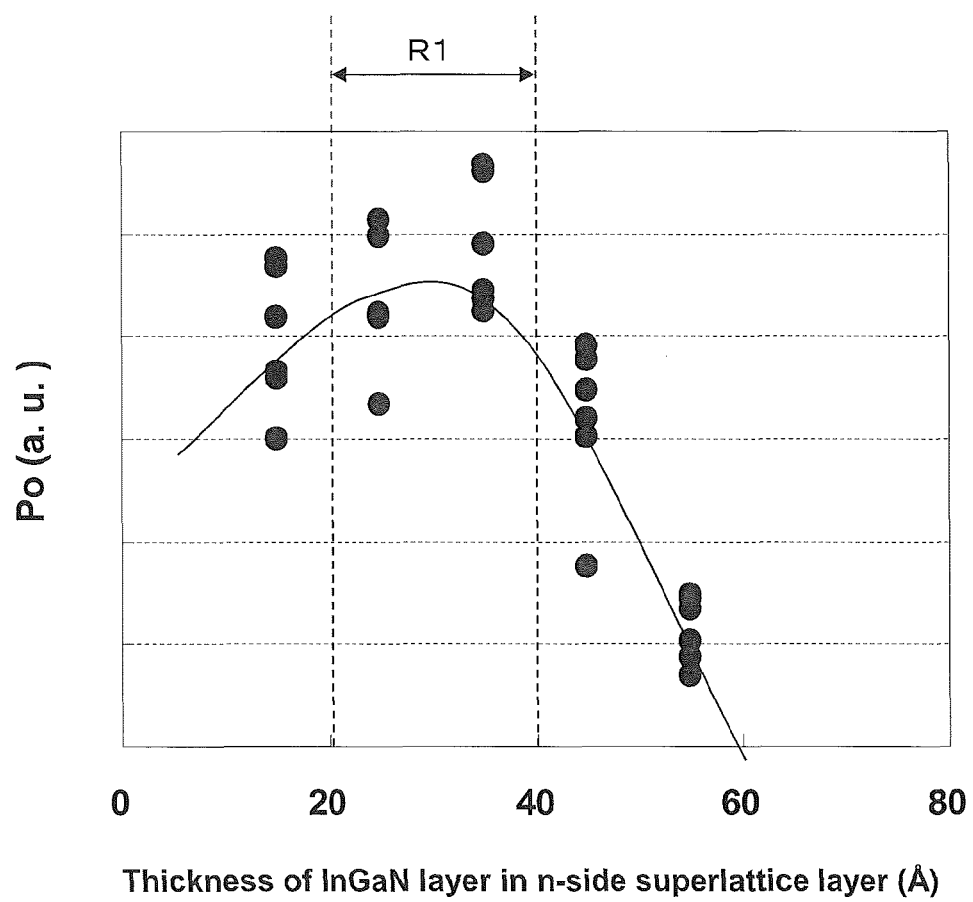
FIG. 7 is a graph showing the relationship between the thickness of an InGaN layer of the superlattice layer and the total radiant flux, when the mean pit diameter of the electrostatic-breakdown-voltage-improving layer is 2,500 Å.

FIG. 7 is a graph showing the relationship between the thickness Y of the InGaN layer 161 of the n-side superlattice layer 160 and the total radiant flux Po, when the mean pit diameter D at the top surface of the second ESD layer 150 was constantly 2,500 Å. As shown in FIG. 7, when the thickness Y of the InGaN layer 161 falls within the range R1, the total radiant flux Po is sufficiently large. In other words, when the thickness Y of the InGaN layer 161 is excessively small, the total radiant flux Po is small, whereas when the thickness Y of the InGaN layer 161 is excessively large, the total radiant flux Po is small.

The range R1 corresponds to a thickness Y of the InGaN layer 161 of about 20 Å to about 40 Å. When the thickness Y of the InGaN layer 161 is excessively small, the target effect is insufficient, whereas when the thickness Y of the InGaN layer 161 is excessively large, the light-emitting layer 170 formed on the n-side superlattice layer 160 has poor crystallinity.

Figure 8:
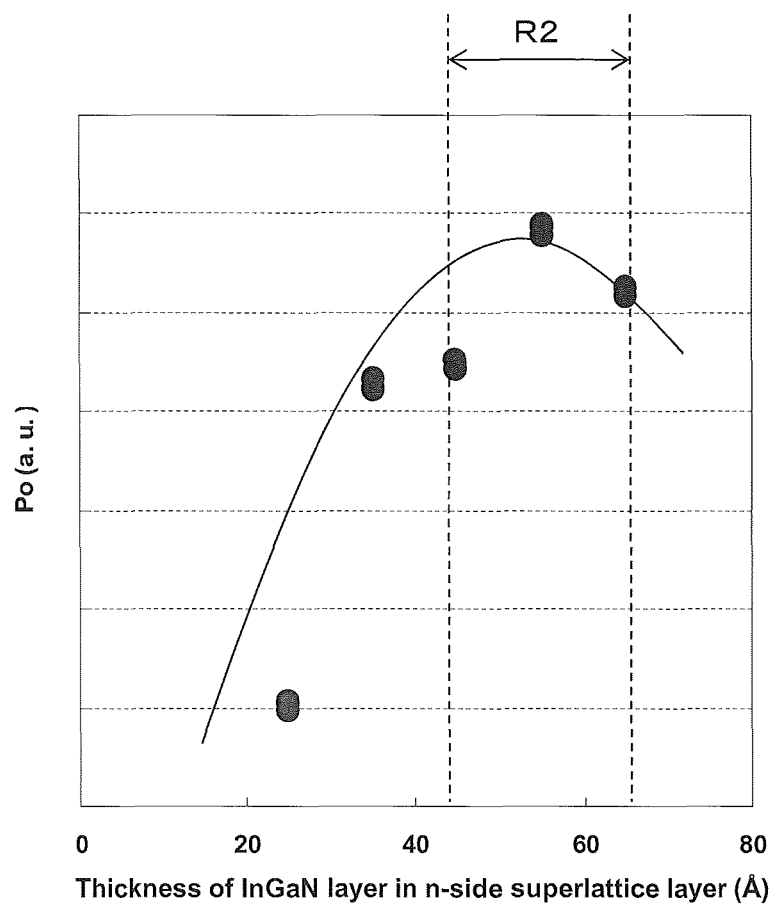
FIG. 8 is a graph showing the relationship between the thickness of an InGaN layer of the superlattice layer and the total radiant flux, when the mean pit diameter of the electrostatic-breakdown-voltage-improving layer is 1,500 Å.

FIG. 8 is a graph showing the relationship between the thickness Y of the InGaN layer 161 of the n-side superlattice layer 160 and the total radiant flux Po, when the mean pit diameter D at the top surface of the second ESD layer 150 was constantly 1,500 Å. As shown in FIG. 8, when the thickness Y of the InGaN layer 161 falls within the range R2, the total radiant flux Po is sufficiently large. In other words, when the thickness Y of the InGaN layer 161 is excessively small, the total radiant flux Po is small, whereas when the thickness Y of the InGaN layer 161 is excessively large, the total radiant flux Po is small.

The range R2 corresponds to a thickness Y of the InGaN layer 161 of about 45 Å to about 65 Å. The thickness range R2 is considerably larger than the thickness range R1. The reason for this is as follows. The smaller the mean pit diameter D, the smaller the extent of biaxial stress relaxation in the light-emitting layer 170. As a result, the n-side superlattice layer 160 must more efficiently absorb strain. That is, the thickness Y must be increased. Thus, the thickness Y of the InGaN layer 161 included in the second ESD layer 150 must be modified in response to the mean pit diameter D.

Figure 9:
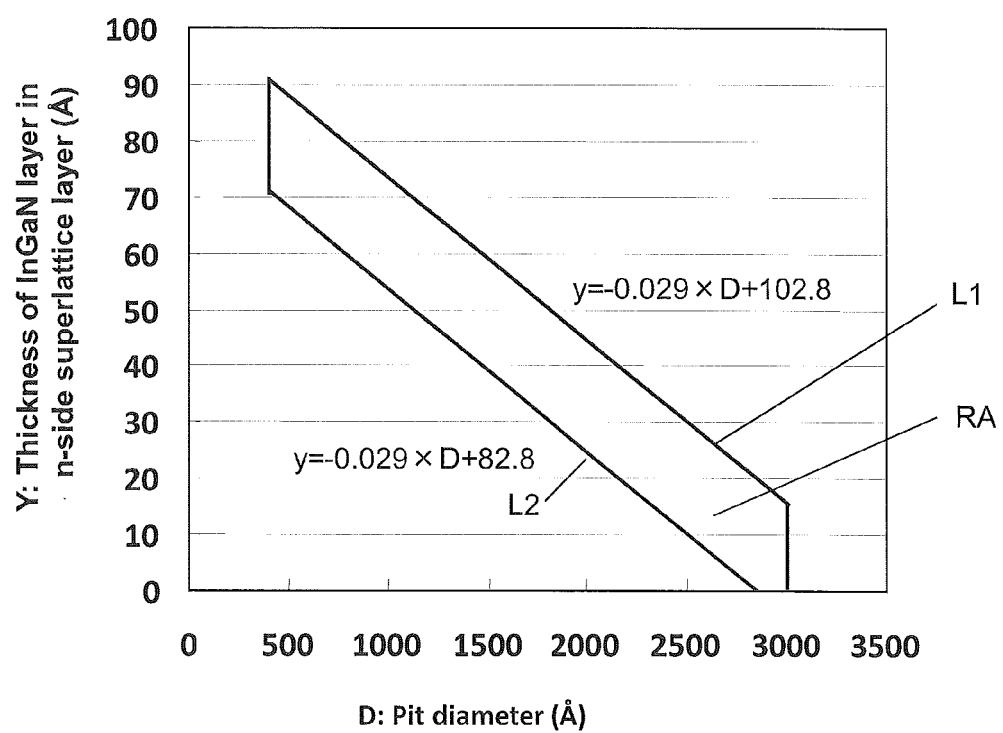
FIG. 9 is a graph showing the relationship between and the mean pit diameter of the electrostatic-breakdown-voltage-improving layer and the thickness of an InGaN layer of the superlattice layer.

FIG. 9 is a graph collectively showing the results. When the relevant parameters are in the region which is outside the region RA and is above the line segment L1, the crystallinity of the n-side superlattice layer 160 is poor. Therefore, the crystallinity of the light-emitting layer 170 formed on the superlattice layer 160 decreases. As a result, under these conditions, the light emission intensity of the semiconductor light-emitting device is low. When the relevant parameters are in the region which is outside the region RA and is under the line segment L2, the effect of relaxing strain is poor. As a result, under these conditions, the light emission intensity of the semiconductor light-emitting device is low.

In FIG. 9, the region RA defined by the two line segment corresponds to the aforementioned conditions (1) and (2). That is, the mean pit diameter D of the second ESD layer 150 and the thickness Y of the InGaN layer 161 included in the n-side superlattice layer 160 are selected so as to meet the conditions (1) and (2). Needless to say, Y is greater than 0.

5-2. Reverse Current

In another experiment, reverse current was measured when reverse voltage was applied to a semiconductor light-emitting device. In application of reverse voltage to a semiconductor light-emitting device, the reverse current is preferably small, since a certain level of reverse current may result in thermal breakage of the semiconductor light-emitting device. Table 1 shows the current values as measured in a semiconductor light-emitting device upon application of a reverse voltage of −5 V.

The current varies in accordance with the mean pit diameter D that measured at the top surface of the second ESD layer 150. When the mean pit diameter D is larger, the layers on the second ESD layer 150; i.e., the n-type superlattice layer 160, the light-emitting layer 170, and the p-side superlattice layer 180 have a smaller total thickness. In other words, in the portions above the pits X, the distance between the p-type semiconductor layer and the n-type semiconductor layer is small. Thus, when reverse voltage is applied, the field intensity at the portions where the distance between the p-type semiconductor layer and the n-type semiconductor layer is small is greater than the other portions. Therefore, the portions where the distance between the p-type semiconductor layer and the n-type semiconductor layer is small serve as current pathways that facilitate reverse current flow. That is, conceivably, the larger the mean pit diameter D, the greater the reverse current.

As shown in Table 1, upon application of a reverse voltage of −5 V, a current of $1.0 \times 10^{-7}$ (A) or lower flows when the mean pit diameter D is 350 Å, 600 Å, 840 Å, 1,080 Å, and 1,320 Å. When the mean pit diameter D is 1,560 Å, the current is larger than $1.0 \times 10^{-7}$ (A).

In other words, when the mean pit diameter D is 1,500 Å or less, the reverse current is sufficiently small. In this case, durability to reverse voltage is ensured. Therefore, the mean pit diameter D (Å) preferably satisfies the following condition (3):

$$500 \text{ Å} \leq D \leq 1{,}500 \text{ Å} \tag{3}$$

In this case, the semiconductor light-emitting device can provide high brightness. Also, the semiconductor light-emitting device has durability to reverse voltage.

TABLE 1

| Mean pit diameter D (Å) | Current (A) under reverse voltage of −5 V |
|---|---|
| 350 | $9.0 \times 10^{-9}$ |
| 600 | $1.0 \times 10^{-8}$ |
| 840 | $1.2 \times 10^{-8}$ |
| 1,080 | $3.0 \times 10^{-8}$ |
| 1,320 | $8.0 \times 10^{-8}$ |
| 1,560 | $1.1 \times 10^{-7}$ |

6. MODIFICATIONS

6-1. Alternative Underlying Layer Instead of Electrostatic-Breakdown-Voltage-Improving Layer In the aforementioned embodiment, the electrostatic-breakdown-voltage-improving layer (the first ESD layer 140 and the second ESD layer 150) was provided with pits X. However, the semiconductor layer provided with pits X is not limited to the electrostatic-breakdown-voltage-improving layer (the first ESD layer 140 and the second ESD layer 150), and any underlying layer of the n-side superlattice layer 160 may be provided with pits. Such an underlying layer may be made of any Group III nitride semiconductor such as GaN, AlGaN, InGaN, AlInGaN, etc. These materials may be used in combination. The underlying layer may or may not be doped with a dopant. In the case of a non-doped underlying layer, the n-type conducting character may be attained by a residual impurity or a lattice defect.

Needless to say, the thus-provided pits X have a mean pit diameter D satisfying the condition (1). Instead of forming the first electrostatic-breakdown-voltage-improving layer and the second electrostatic-breakdown-voltage-improving layer, the underlying layer is formed.

6-2. n-Side Superlattice Layer

In the aforementioned embodiment, the InGaN layer 161 and the n-type GaN layer 162 were sequentially deposited on the second ESD layer 150, to thereby form the n-side superlattice layer 160. However, after formation of the n-type GaN layer on the second ESD layer 150, the InGaN layer may be formed on the n-type GaN layer. In the latter case, the conditions (1) and (2) may be applicable.

Also, in the aforementioned embodiment, the InGaN layer 161 was employed as a small-bandgap layer, and the n-type GaN layer 162 was employed as a large-bandgap layer. However, an AlInGaN layer may be employed as a small-bandgap layer. In the latter case, the AlInGaN layer is an Indium-containing layer. As a large-bandgap layer, any of an AlGaN layer, an InGaN layer, and an AlInGaN layer may be employed.

In some cases, two or more Indium-containing layers are present in an layer unit forming the n-side superlattice layer 160. In such a case, the In compositional ratio is large in a layer having the smallest bandgap. Thus, such a layer having the smallest bandgap satisfies the conditions (1) and (2). These layer may or may not be doped with a dopant.

6-3. p-Electrode

In the aforementioned embodiment, the p-type electrode P1 was formed of ITO, which is a transparent conductive oxide. However, other than ITO, transparent conductive oxides such as ICO, IZO, ZnO, $TiO_2$, $NbTiO_2$, and $TaTiO_2$ may also be used. A metal electrode made of a metallic material may be provided on the p-type electrode P1. Alternatively, another electrode may be provided on the p-type electrode P1.

6-4. Combinations

The aforementioned modifications may be employed in any combination.

7. SUMMARY OF THE PRESENT EMBODIMENT

As described hereinabove, in the light-emitting device 100 of the present embodiment, the mean pit diameter D measured at the top surface of the second ESD layer 150 and the thickness Y of the InGaN layer 161 which is included in the n-side superlattice layer 160 and which is formed on the second ESD layer 150 satisfy the aforementioned conditions (1) and (2). As a result, the light-emitting layer 170 has substantially no strain. Therefore, a semiconductor light-emitting device having high light emission intensity can be provided.

In the method of the present embodiment for producing the light-emitting device 100, the mean pit diameter D measured at the top surface of the second ESD layer 150 and the thickness Y of the InGaN layer 161 which is included in the n-side superlattice layer 160 and which is formed on the second ESD layer 150 are selected in advance from preferred ranges. As a result, the light-emitting layer 170 can be formed on the strain-relaxed n-side superlattice layer 160. Therefore, the light-emitting layer 170 having high crystallinity can be provided. That is, a semiconductor light-emitting device having high light emission intensity can be produced.

Since the aforementioned embodiments are merely examples, it should be understood that those skilled in the art can perform various variations and modifications, without deviating the scope of the present invention. The deposit structure of the deposited body is not necessarily limited to those illustrated. The deposit structure, the number of repetitions of the layers, etc. may be determined. The layer formation method is not limited to metal-organic chemical vapor deposition (MOCVD), and any other methods may be employed, so long as the semiconductor crystal growth is performed by use of a carrier gas. That is, semiconductor layers may be formed through liquid-phase epitaxy, molecular-beam epitaxy, or another epitaxial growth technique.

What is claimed is:

1. A Group III nitride semiconductor light-emitting device comprising an underlying layer formed of a Group III nitride semiconductor, a superlattice layer formed on the underlying layer, and a light-emitting layer formed on the superlattice layer, wherein:
   the underlying layer has pits;
   the superlattice layer has at least an Indium-containing layer formed of an Indium-containing Group III nitride semiconductor;
   the pits have a mean pit diameter D (Å) as measured at the interface between the underlying layer and the superlattice layer which pit diameter satisfies the following condition: 500 Å≤D≤3,000 Å; and
   the Indium-containing layer has a thickness Y (Å) satisfying the following condition:

$-0.029 \times D + 82.8 \leq Y \leq -0.029 \times D + 102.8.$

2. The Group III nitride semiconductor light-emitting device according to claim 1, wherein:
   the superlattice layer is formed of repeatedly deposited layer units;
   each layer unit has two or more Indium-containing layers; and
   the thickness Y (Å) of the Indium-containing layer is that measured for a layer of the superlattice layer having the smallest bandgap.

3. The Group III nitride semiconductor light-emitting device according to claim 2, wherein the bottom ends of the pits are located within the thickness of the underlying layer.

4. The Group III nitride semiconductor light-emitting device according to claim 3, wherein the underlying layer is an electrostatic-breakdown-voltage-improving layer for preventing electrostatic breakdown of each semiconductor layer.

5. The Group III nitride semiconductor light-emitting device according to claim 3, wherein the mean pit diameter D (Å) satisfies the following condition:

$500 \text{ Å} \leq D \leq 1{,}500 \text{ Å}.$

6. The Group III nitride semiconductor light-emitting device according to claim 1, wherein the bottom ends of the pits are located within the thickness of the underlying layer.

7. The Group III nitride semiconductor light-emitting device according to claim 6, wherein the underlying layer is an electrostatic-breakdown-voltage-improving layer for preventing electrostatic breakdown of each semiconductor layer.

8. The Group III nitride semiconductor light-emitting device according to claim 6, wherein the mean pit diameter D (Å) satisfies the following condition:

$500 \text{ Å} \leq D \leq 1{,}500 \text{ Å}.$

9. The Group III nitride semiconductor light-emitting device according to claim 2, wherein the underlying layer is an electrostatic-breakdown-voltage-improving layer for preventing electrostatic breakdown of each semiconductor layer.

10. The Group III nitride semiconductor light-emitting device according to claim 6, wherein the mean pit diameter D (Å) satisfies the following condition:

$500 \text{ Å} \leq D \leq 1{,}500 \text{ Å}.$

11. The Group III nitride semiconductor light-emitting device according to claim 1, wherein the underlying layer is an electrostatic-breakdown-voltage-improving layer for preventing electrostatic breakdown of each semiconductor layer.

12. The Group III nitride semiconductor light-emitting device according to claim 1, wherein the mean pit diameter D (Å) satisfies the following condition:

$500 \text{ Å} \leq D \leq 1{,}500 \text{ Å}.$

13. A method for producing a Group III nitride semiconductor light-emitting device comprising:
    forming an underlying layer,
    forming a superlattice layer on the underlying layer, and
    forming a light-emitting layer on the superlattice layer;
    wherein, in formation of the underlying layer, pits are provided in the underlying layer such that the mean pit diameter D (Å) as measured at the interface between the underlying layer and the superlattice layer satisfies the following condition:

$500 \text{ Å} \leq D \leq 3{,}000 \text{ Å}; \text{ and,}$ in formation of the superlattice layer, an Indium-containing layer is formed from an Indium-containing Group III nitride semiconductor such that the Indium-containing layer has a thickness Y (Å) satisfying the following condition:

$-0.029 \times D + 82.8 \leq Y \leq -0.029 \times D + 102.8.$

14. The method for producing a Group III nitride semiconductor light-emitting device according to claim 13, wherein, in formation of the superlattice layer,
   layer units each having two or more Indium-containing layers are repeatedly deposited, and
   an Indium-containing layer of the superlattice layer having the smallest bandgap is formed so as to have the thickness Y (Å) of the Indium-containing layer.

15. The method for producing a Group III nitride semiconductor light-emitting device according to claim 14, wherein the mean pit diameter D (Å) is adjusted to satisfy the following condition: 500 Å≤D≤1,500 Å.

16. The method for producing a Group III nitride semiconductor light-emitting device according to claim 13, wherein the mean pit diameter D (Å) is adjusted to satisfy the following condition: 500 Å≤D≤1,500 Å.

* * * * *